United States Patent
Yoneda et al.

(10) Patent No.: US 11,807,721 B2
(45) Date of Patent: Nov. 7, 2023

(54) METHOD FOR PRODUCING POLYIMIDE PRECURSOR, METHOD FOR PRODUCING PHOTOSENSITIVE RESIN COMPOSITION, METHOD FOR PRODUCING PATTERN CURED PRODUCT, METHOD FOR PRODUCING INTERLAYER INSULATING FILM, COVER COAT LAYER OR SURFACE PROTECTIVE FILM, AND METHOD FOR PRODUCING ELECTRONIC COMPONENT

(71) Applicant: HD MICROSYSTEMS, LTD., Tokyo (JP)

(72) Inventors: Satoshi Yoneda, Hitachi (JP); Tetsuya Enomoto, Hitachi (JP)

(73) Assignee: HD MICROSYSTEMS, LTD., Tokyo (JP)

( * ) Notice: Subject to any disclaimer, the term of this patent is extended or adjusted under 35 U.S.C. 154(b) by 312 days.

(21) Appl. No.: 17/043,444

(22) PCT Filed: Apr. 3, 2018

(86) PCT No.: PCT/JP2018/014273
§ 371 (c)(1),
(2) Date: Sep. 29, 2020

(87) PCT Pub. No.: WO2019/193647
PCT Pub. Date: Oct. 10, 2019

(65) Prior Publication Data
US 2021/0018837 A1 Jan. 21, 2021

(51) Int. Cl.
*G03F 7/40* (2006.01)
*C08G 73/12* (2006.01)
*C08F 290/06* (2006.01)
*G03F 7/028* (2006.01)
*G03F 7/039* (2006.01)
*G03F 7/038* (2006.01)

(52) U.S. Cl.
CPC ........ *C08G 73/121* (2013.01); *C08F 290/065* (2013.01); *C08G 73/12* (2013.01); *G03F 7/028* (2013.01); *G03F 7/039* (2013.01); *G03F 7/0387* (2013.01); *G03F 7/40* (2013.01)

(58) Field of Classification Search
CPC ........ G03F 7/031; G03F 7/037; G03F 7/0387; G03F 7/0388; G03F 7/40; C08G 73/12; C08G 73/121
See application file for complete search history.

(56) References Cited

U.S. PATENT DOCUMENTS

| | | | | |
|---|---|---|---|---|
| 5,025,088 A * | 6/1991 | Maeda | ................... | G03F 7/0757 |
| | | | | 430/283.1 |
| 6,071,667 A * | 6/2000 | Hagiwara | ............. | G03F 7/0387 |
| | | | | 430/283.1 |
| 8,932,801 B2 * | 1/2015 | Chou | ................... | C08G 73/126 |
| | | | | 430/287.1 |

(Continued)

FOREIGN PATENT DOCUMENTS

| | | | | |
|---|---|---|---|---|
| DE | 19928742 B4 * | 10/2008 | ........... | C07C 323/47 |
| JP | 2001-125266 A | 5/2001 | | |
| JP | 2001-214057 A | 8/2001 | | |

(Continued)

*Primary Examiner* — John S Chu
(74) *Attorney, Agent, or Firm* — FITCH, EVEN, TABIN & FLANNERY, LLP

(57) ABSTRACT

A method for producing a polyimide precursor having a structural unit represented by the following formula (1),
comprising the following steps (i) and (ii), wherein at least one of the steps of (i) and (ii) is carried out in a solvent comprising a compound having an ether bond and an amide bond:

(i) a step of reacting carboxylic anhydride with a diamine compound to obtain a polyimide precursor having a structural unit represented by the following formula (2); and (ii) a step of reacting the polyimide precursor having a structural unit represented by the formula (2) with a compound represented by the following formula (8), and reacting the reactant with a compound represented by the following formula (9) to obtain a polyimide precursor having a structural unit represented by the following formula (1):

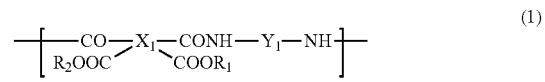

wherein in the formula (1), at least one of $R_1$ and $R_2$ is a group represented by the formula (3):

-continued

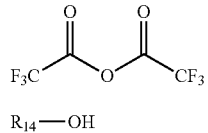

(8)

(9)

$R_{14}$—OH

8 Claims, 1 Drawing Sheet

(56) References Cited

U.S. PATENT DOCUMENTS

2009/0181324 A1* 7/2009 Chou .................. C08G 73/124
522/167

FOREIGN PATENT DOCUMENTS

| JP | 2003-122004 A | 4/2003 | |
|---|---|---|---|
| JP | 2009-265520 A | 11/2009 | |
| JP | 2011186049 A * | 9/2011 | ......... C08G 73/1067 |
| JP | 2017-037129 A | 2/2017 | |
| JP | 2017-517582 A | 6/2017 | |
| WO | 2015/012385 A1 | 1/2015 | |
| WO | 2016/147958 A1 | 9/2016 | |
| WO | WO-2017068936 A1 * | 4/2017 | ......... C08G 73/1032 |
| WO | 2018/038309 A1 | 3/2018 | |

* cited by examiner

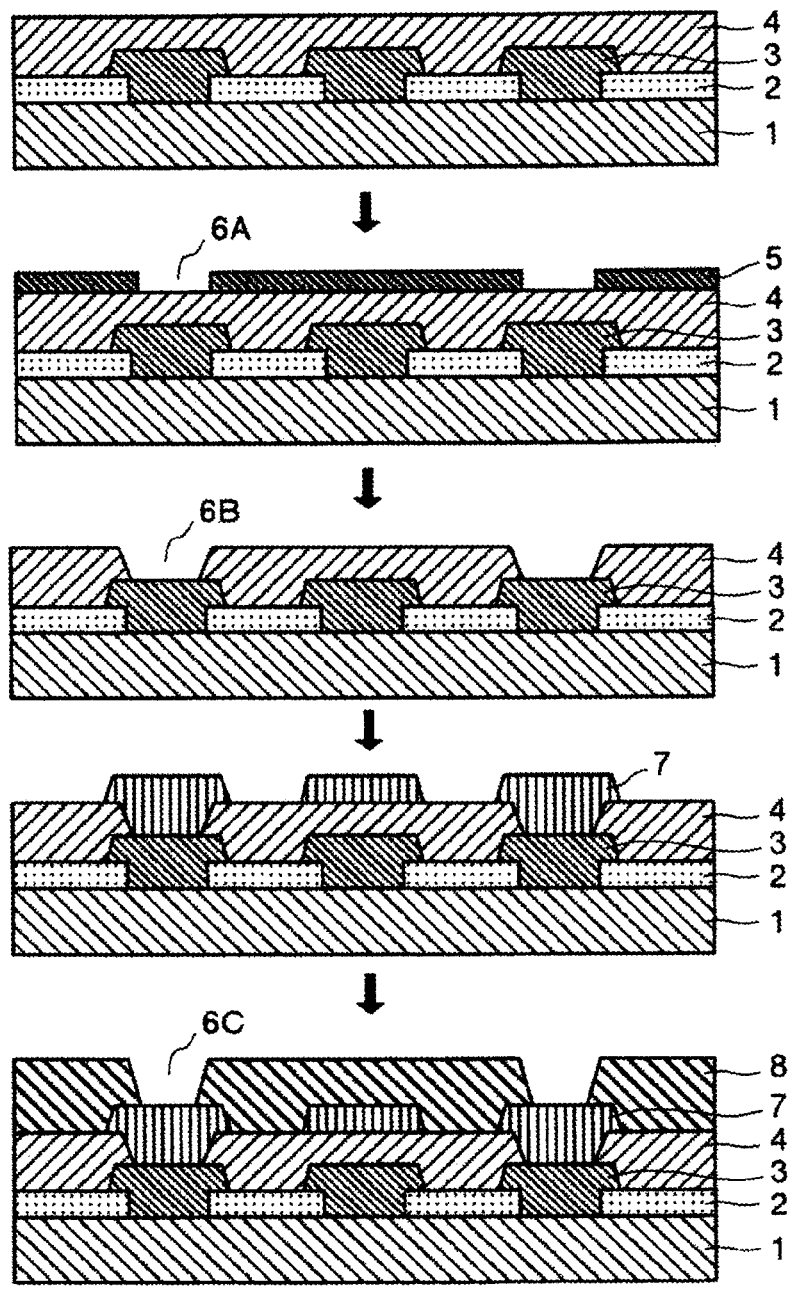

METHOD FOR PRODUCING POLYIMIDE PRECURSOR, METHOD FOR PRODUCING PHOTOSENSITIVE RESIN COMPOSITION, METHOD FOR PRODUCING PATTERN CURED PRODUCT, METHOD FOR PRODUCING INTERLAYER INSULATING FILM, COVER COAT LAYER OR SURFACE PROTECTIVE FILM, AND METHOD FOR PRODUCING ELECTRONIC COMPONENT

CROSS-REFERENCE TO RELATED APPLICATIONS

This application is a U.S. national phase application filed under 35 U.S.C. § 371 of International Application No. PCT/JP2018/014273, filed Apr. 3, 2018, designating the United States, which is hereby incorporated herein by reference in its entirety.

TECHNICAL FIELD

The invention relates to a method for producing a polyimide precursor, a method for producing a photosensitive resin composition, a method for producing a pattern cured product, a method for producing an interlayer insulating film, a cover coat layer or a surface protective film, and a method for producing an electronic component.

BACKGROUND ART

In recent years, the miniaturization of transistors which has supported the enhancement of the performance of computers has come to the limit of scaling law, and a laminated device structure in which semiconductor elements are three-dimensionally laminated for further enhancement of the performance and speed has attracted attention.

Polyimide or polybenzoxazole having excellent heat resistance, electrical characteristics, mechanical characteristics, and the like has been used for the surface protective film and the interlayer insulating film of the semiconductor element. In recent years, a photosensitive resin composition in which photosensitive characteristics are imparted to these resins itself has been used, and by using this photosensitive resin composition, the producing process of a pattern cured film can be simplified, and a complicated producing process can be shortened (for example, refer to Patent Document 1).

Patent Document 2 discloses a method for producing a photosensitive resin composition in which polybenzoxazole can be obtained by reacting an acid halide with diamine in a solvent containing a compound having an ether bond and an amide bond.

RELATED ART DOCUMENT

Patent Documents

[Patent Document 1] JP 2009-265520 A
[Patent Document 2] JP 2017-37129 A

SUMMARY OF THE INVENTION

It is an object of the invention to provide a method for producing a polyimide precursor, a method for producing a photosensitive resin composition, a method for producing a pattern cured product, a method for producing an interlayer insulating film, a cover coat layer or a surface protective film, and a method for producing an electronic component, all of which are excellent in workability.

The inventors have found that a polyimide precursor, a polyamic acid, a reaction intermediate thereof and the like have poor solubility in a solvent and a reaction solvent is limited.

In addition, when a polyimide precursor and a polyamide acid are used for redistribution layer, a fine wiring is often required to improve the integration degree of semiconductor devices and to trivialize chips, etc., and in such case, the inventors have found empirically that, in order to improve the reliability between wiring, a method for producing in which a halide, especially hydrogen chloride, is not contained in a process for producing as a by-product is required.

Further, the inventors have found empirically that, in a method for producing, when a carboxylic acid chloride is used, a by-product containing chlorine remains in a resin product and the reliability may be deteriorated when the resin is applied to a semiconductor product.

In Patent Document 2, a method for producing a photosensitive resin composition is disclosed in which N-methyl-2-pyrrolidone (NMP) is not used from the viewpoint of reducing environmental load.

However, the method reported as Examples is a method for synthesizing a polybenzoxazole precursor, and neither synthesis nor result are described for polyimides.

In view of the above problems, as a result of extensive studies, the inventors have found that a specific solvent is used for producing a polyimide precursor, and have completed the present invention.

According to the invention, the following method for producing a polyimide precursor and the like is provided.

1. A method for producing a polyimide precursor having a structural unit represented by the following formula (1), comprising the following steps (i) and (ii), wherein at least one of the steps (i) and (ii) is carried out in a solvent comprising a compound having an ether bond and an amide bond:

(i) a step of reacting carboxylic anhydride with a diamine compound to obtain a polyimide precursor having a structural unit represented by the following formula (2); and (ii) a step of reacting the polyimide precursor having a structural unit represented by the formula (2) with a compound represented by the following formula (8), and reacting the reactant with a compound represented by the following formula (9) to obtain a polyimide precursor having a structural unit represented by the following formula (1):

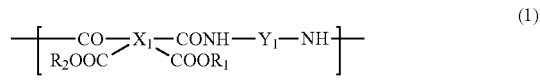

wherein in the formula (1), $X_1$ is a tetravalent group having one or more aromatic groups; —$COOR_1$ group and —CONH— group are on the ortho-position to each other; —$COOR_2$ group and —CO— group are on the ortho-position to each other; $Y_1$ is a divalent aromatic group; $R_1$ and $R_2$ are independently a hydrogen atom, a group represented by the following formula (3), or a aliphatic hydrocarbon group including 1 to 4 carbon atoms; and at least one of $R_1$ and $R_2$ is a group represented by the formula (3):

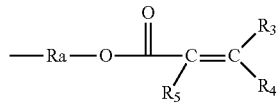

(3)

wherein in the formula (3), Ra is a divalent aliphatic hydrocarbon group including 1 to 20 carbon atoms; and $R_3$ to $R_5$ are independently a hydrogen atom or an aliphatic hydrocarbon group including 1 to 3 carbon atoms:

(2)

wherein in the formula (2), $X_1$ is a group corresponding to $X_1$ of the formula (1); and $Y_1$ is as defined in the formula (1):

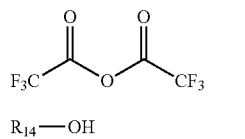

(8)

$R_{14}$—OH (9)

wherein in the formula (9), $R_{14}$ is a group represented by the formula (3).

2. The method for producing a polyimide precursor according to 1, wherein the compound having an ether bond and an amide bond is a compound represented by the following formula (10):

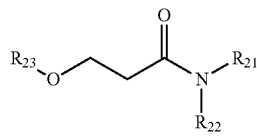

(10)

wherein in the formula (10), $R_{21}$ to $R_{23}$ are independently an alkyl group including 1 to 10 carbon atoms.

3. A method for producing a photosensitive resin composition comprising:
producing a polyimide precursor by the method according to 1 or 2; and
mixing the polyimide precursor, (B) a polymerizable monomer, and (C) a photopolymerization initiator to obtain a photosensitive resin composition.

4. A method for producing a pattern cured product comprising the following steps:
producing a photosensitive resin composition by the method according to 3;
coating the photosensitive resin composition on a substrate and drying to form a photosensitive resin film;
pattern-exposing the photosensitive resin film to obtain a resin film;
developing the resin film after the pattern exposure using an organic solvent to obtain a pattern resin film; and
heat-treating the pattern resin film.

5. The method for producing a pattern cured product according to 4, wherein a temperature of the heat treatment is 200° C. or less.

6. A method for producing an interlayer insulating film, a cover coat layer or a surface protective film, which is produced using the pattern cured product produced by the method according to 4 or 5.

7. A method for producing an electronic component, which is produced using the interlayer insulating film, the cover coat layer or the surface protective film produced by the method according to 6.

According to the invention, a method for producing a polyimide precursor, a method for producing a photosensitive resin composition, a method for producing a pattern cured product, a method for producing an interlayer insulating film, a cover coat layer or a surface protective film, and a method for producing an electronic component, all of which are excellent in workability, can be provided.

BRIEF DESCRIPTION OF THE DRAWINGS

FIG. 1 is a process diagram of a method for producing an electronic component according to an embodiment of the invention.

MODE FOR CARRYING OUT THE INVENTION

Hereinafter, embodiments of a method for producing a polyimide precursor, a method for producing a photosensitive resin composition, a method for producing a pattern cured product, a method for producing an interlayer insulating film, a cover coat layer or a surface protective film, and a method for producing an electronic component will be described in detail. The invention is not limited to the following embodiments.

In the specification, "A or B" may include either or both of A and B. Moreover, a term "step" herein includes not only an independent step, but also a step if expected action of the step is achieved, even when the step is not clearly distinguishable from other steps.

A numeric value range represented by using "to" indicates the range including numeric values described before and after "to" as a minimum value and a maximum value, respectively. Moreover, when a plurality of materials corresponding to each component exist in a composition, unless otherwise specified, a content of each component in the composition herein means a total amount of the plurality of materials existing in the composition. Further, unless otherwise specified, materials listed as examples may be used alone or in combination of two or more.

A method for producing a polyimide precursor of the invention is a method for producing a polyimide precursor having a structural unit represented by the following formula (1):
comprising the following steps (i) and (ii), wherein at least one of the steps of (i) and (ii) is carried out in a solvent comprising a compound having an ether bond and an amide bond:
(i) a step of reacting carboxylic anhydride with a diamine compound to obtain a polyimide precursor having a structural unit represented by the following formula (2); and (ii) a step of reacting the polyimide precursor having a structural unit represented by the formula (2) with a compound represented by the following formula (8), and reacting the reactant with a compound represented by the following formula (9) to obtain a polyimide precursor having a structural unit represented by the following formula (1):

(1)

wherein in the formula (1), $X_1$ is a tetravalent group having one or more aromatic groups; —$COOR_1$ group and —CONH— group are on the ortho-position to each other; —$COOR_2$ group and —CO— group are on the ortho-position to each other; $Y_1$ is a divalent aromatic group; $R_1$ and $R_2$ are independently a hydrogen atom, a group represented by the following formula (3), or a aliphatic hydrocarbon group including 1 to 4 carbon atoms; and at least one of $R_1$ and $R_2$ is a group represented by the formula (3):

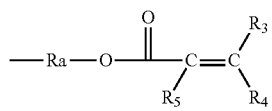
(3)

wherein in the formula (3), Ra is a divalent aliphatic hydrocarbon group including 1 to 20 carbon atoms; and $R_3$ to $R_5$ are independently a hydrogen atom or an aliphatic hydrocarbon group including 1 to 3 carbon atoms:

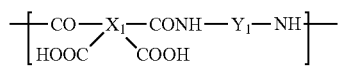
(2)

wherein in the formula (2), $X_1$ is a group corresponding to $X_1$ of the formula (1) (i.e., $X_1$ is a tetravalent group having one or more aromatic groups; one of the two —COOH groups and —CONH— group are on the ortho-position to each other; and the other of the —COOH groups and —CO— group are on the ortho-position to each other); and $Y_1$ is as defined in the formula (1):

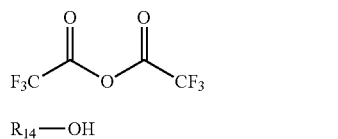
(8)

$R_{14}$—OH (9)

wherein in the formula (9), $R_{14}$ is a group represented by the formula (3).

As a result, workability can be improved. Specifically, it is possible to suppress gelation, to easily filtrate, and to stably obtain a polyimide precursor having a high molecular weight.

Further, as an optional effect, a polyimide precursor containing no chlorine can be obtained, and a highly reliable electronic component can be obtained.

As an optional effect, an environmental load can be reduced.

The polyimide precursor having a structural unit represented by the formula (1) is not particularly limited, but a polyimide precursor having high transmittance when an i-ray is used for a light source at the time of patterning and exhibiting high cured product characteristics even when cured at a low temperature of 200° C. or less is preferred.

The polyimide precursor having a structural unit represented by the formula (1) is preferably for a photosensitive resin composition.

In the tetravalent group having one or more (preferably 1 to 3, more preferably 1 or 2) aromatic group of $X_1$ of the formula (1), the aromatic group may be an aromatic hydrocarbon group or an aromatic heterocyclic group. An aromatic hydrocarbon group is preferred.

Examples of the aromatic hydrocarbon group of $X_1$ of the formula (1) include: divalent to tetravalent groups formed from a benzene ring; divalent to tetravalent groups formed from a naphthalene; divalent to tetravalent groups formed from a perylene; and the like.

Examples of the tetravalent group having one or more aromatic groups of $X_1$ of the formula (1) include, but are not limited to, the following tetravalent groups of the formula (4):

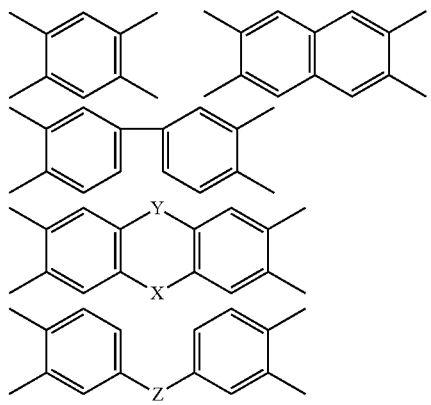
(4)

In the formula (4), X and Y independently represent a divalent group which is not conjugated to a benzene ring to which each is bonded, or a single bond; Z is an ether group (—O—) or a sulfide group (—S—) (—O— is preferable).

In the formula (4), the divalent group of X and Y, which is not conjugated to the benzene ring to which each is bonded, is preferably —O—, —S—, a methylene group, a bis(trifluoromethyl)methylene group, or a difluoromethylene group, more preferably —O—.

The divalent aromatic group of $Y_1$ of the formula (1) may be a divalent aromatic hydrocarbon group or a divalent aromatic heterocyclic group. Among them, a divalent aromatic hydrocarbon group is preferred.

Examples of the divalent aromatic heterocyclic group of $Y_1$ of the formula (1) include a divalent group formed from carbazole, a divalent group formed from dimethylthiophene sulfone, and the like.

The divalent aromatic hydrocarbon group of $Y_1$ of the formula (1) includes, but are not limited to, a group represented by the following formula (5):

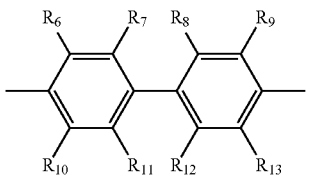

(5)

In the formula (5), $R_6$ to $R_{13}$ are independently a hydrogen atom, a monovalent aliphatic hydrocarbon group, or a monovalent organic group having a halogen atom.

The monovalent aliphatic hydrocarbon group (preferably including 1 to 10 carbon atoms, more preferably including 1 to 6 carbon atoms) of $R_6$ to $R_{13}$ of the formula (5) is preferably a methyl group.

The monovalent organic group having a halogen atom (preferably fluorine atom) of $R_6$ to $R_{13}$ of the formula (5) is preferably a monovalent aliphatic hydrocarbon group (preferably including 1 to 10 carbon atoms, more preferably including 1 to 6 carbon atoms), and preferably a trifluoromethyl group.

Examples of the aliphatic hydrocarbon group including 1 to 4 (preferably 1 or 2) carbon atoms of $R_1$ and $R_2$ of the formula (1) include a methyl group, an ethyl group, an n-propyl group, a 2-propyl group, an n-butyl group, and the like.

At least one of $R_1$ and $R_2$ of the formula (1) is a group represented by the formula (3), and both are preferably groups represented by the formula (3).

The divalent aliphatic hydrocarbon group including 1 to 20 (preferably 1 to 10, more preferably 2 to 5, and still more preferably 2 or 3) carbon atoms of Ra of the formula (3) may be linear or may have a cyclic structure. Examples thereof include a methylene group, an ethylene group, —CH$_2$— (C$_6$H$_4$)—CH$_2$— group, and the like.

Examples of the aliphatic hydrocarbon group including 1 to 3 (preferably 1 or 2) carbon atoms of $R_3$ to $R_5$ of the formula (3) include a methyl group, an ethyl group, an n-propyl group, a 2-propyl group, and the like. A methyl group is preferable.

The group represented by the formula (3) is preferably a group represented by the following formula (3A).

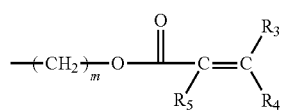

(3A)

In the formula (3A), $R_3$ to $R_5$ are as defined in the formula (3); m is an integer of 1 to 10 (preferably a integer of 2 to 5, more preferably 2 or 3).

In the polyimide precursor having a structural unit represented by the formula (1), the ratio of the carboxy group esterified with the group represented by the formula (3), based on the total carboxy group and the total carboxy ester, is preferably 50 mol % or more, more preferably 60 to 100 mol %, and still more preferably 70 to 90 mol %.

The ratio of the carboxy group esterified with the group represented by the formula (3) is calculated by NMR-measurement.

The molecular weight of the polyimide precursor having a structural unit represented by the formula (1) is not particularly limited, but the weight-average molecular weight is preferably 10,000 to 200,000.

The weight-average molecular weight is determined by a gel permeation chromatography and obtained by conversion using a standard polystyrene calibration curve.

At least one of steps (i) and (ii) (from the viewpoint of simplification of the process and from the viewpoint of carrying out steps (i) and (ii) in one pot, preferably both of steps (i) and (ii)) are carried out in a solvent containing a compound having an ether bond and an amide bond.

A compound having an ether bond and an amide bond has high solubility of a polyimide precursor having a structural unit represented by the formula (2), and also has an appropriate polarity and does not cause a side reaction, so that the reaction can be smoothly proceeded in steps (i) and (ii).

A compound having an ether bond and an amide bond is preferably a compound represented by the following formula (10).

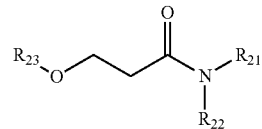

(10)

In the formula (10), $R_{21}$ to $R_{23}$ are independently an alkyl group including 1 to 10 carbon atoms.

Examples of the alkyl group including 1 to 10 (preferably 1 to 3, more preferably 1 or 3) carbon atoms of $R_{21}$ to $R_{23}$ in the formula (10) include a methyl group, an ethyl group, an n-propyl group, an isopropyl group, an n-butyl group, a t-butyl group, a pentyl group, a hexyl group, a heptyl group, an octyl group, and the like.

A compound having an ether bond and an amide bond may be used alone or in combination of two or more.

The solvent may contain a solvent other than the compound having an ether bond and an amide bond.

The solvent other than the compound having an ether bond and an amide bond is not particularly limited as long as it is a commonly used solvent (e.g., an organic solvent). Examples preferably include:

esters such as, ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, γ-butyrolactone, ε-caprolactone, δ-valerolactone, alkyl alkoxy acetate (e.g., methyl alkoxy acetate, ethyl alkoxy acetate, butyl alkoxy acetate (e.g., methyl methoxyacetate, ethyl methoxyacetate, butyl methoxyacetate, methyl ethoxyacetate, ethyl ethoxyacetate, etc.), 3-alkoxypropionate alkyl esters (e.g., methyl 3-alkoxypropionate, ethyl 3-alkoxypropionate (e.g., methyl 3-methoxypropionate, ethyl 3-methoxypropionate, methyl 3-ethoxypropionate, ethyl 3-ethoxypropionate)), 2-alkoxypropionate alkyl esters (e.g., methyl 2-alkoxypropionate, ethyl 2-alkoxypropionate, propyl 2-alkoxypropionate (e.g., methyl 2-methoxypropionate, ethyl 2-methoxypropionate, propyl 2-methoxypropionate, methyl 2-ethoxypropionate, ethyl 2-ethoxypropionate)), methyl 2-alkoxy-2-methylpropionate, ethyl 2-alkoxy-2-methylpropionate (e.g., methyl 2-methoxy-2-methylpropionate, ethyl 2-ethoxy-2-methylpropionate), methyl pyruvate, ethyl pyruvate, propyl pyruvate, methyl acetoacetate, ethyl acetoacetate, methyl 2-oxobutanoate, ethyl 2-oxobutanoate, and the like;

ethers such as, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, and the like;

ketones such as, methyl ethyl ketone, cyclohexanone, cyclopentanone, 2-heptanone, 3-heptanone, and N-methyl-2-pyrrolidone, and the like;

aromatic hydrocarbons such as, toluene, xylene, anisole, limonene, and the like; and sulfoxides such as, dimethylsulfoxide and the like.

The solvent other than the compound having an ether bond and an amide bond may be used alone or in combination of two or more.

The content of the compound having an ether bond and an amide bond is preferably 25 to 100% by mass based on 100% by mass of the solvent.

In the step (i), a carboxylic anhydride and a diamine compound are reacted (preferably condensation-polymerized) to obtain a polyimide precursor having a structural unit represented by the formula (2) (hereinafter, also referred to as a polyamide acid or a polyamic acid).

In the step (i), the carboxylic anhydride is preferably a tetracarboxylic dianhydride represented by the following formula (6).

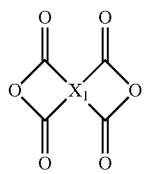

(6)

In the formula (6), $X_1$ is a group corresponding to $X_1$ of the formula (1).

In the step (i), the diamine compound is preferably a diamine compound represented by the following formula (7).

(7)

In the formula (7), $Y_1$ is as defined in formula (1).

The carboxylic anhydride and the diamine compound may be used alone or in combination of two or more.

In the step (i), the temperature and time of the reaction can be appropriately set depending on the type of the carboxylic anhydride and the diamine compound. The time of the reaction is, for example, 30 minutes to 24 hours, and the temperature of the reaction is preferably, for example, 0 to 80° C., and more preferably in the range of 20 to 50° C.

In the step (i), the reaction can be promoted, for example, by stirring.

In the step (ii), a polyimide precursor having a structural unit represented by the formula (2) and a compound represented by the formula (8) are reacted (isoimidized), and the reactant and a compound represented by the formula (9) are reacted (e.g., an isoimide ring is opened and partially esterified) to obtain a polyimide precursor having a structural unit represented by the formula (1).

The reaction with the compound represented by the formula (8) activates the polyimide precursor having the structural unit represented by the formula (2) and promotes the reaction (molecular transformation) with the compound represented by the formula (9).

In place of the compound represented by the formula (8), a known dehydration-condensation agent may be used. Examples of the known dehydration-condensation agent include catalysts such as N,N'-dicyclohexylcarbodiimide (DCC), thionyl chloride, and N-methylynemethylsulfonamide. Further, a tertiary amine such as triethylamine, pyridine, picoline or the like may be added in an amount of 1.00 to 1.20 molar equivalent to the dehydration-condensation agent to promote the reaction.

In the reaction of the polyimide precursor having a structural unit represented by the formula (2) and the compound represented by the formula (8), the temperature and time of the reaction can be appropriately set depending on the type of the compound represented by the formula (8). The time of the reaction is, for example, 1 to 6 hours, and the temperature of the reaction is preferably, for example, at 20 to 70° C.

The reaction with the compound represented by the formula (8) can be promoted, for example, by stirring.

Examples of the compound represented by the formula (9) include 2-hydroxyethyl methacrylate (HEMA), 2-hydroxylethyl acrylate, and the like.

In the reaction with the compound represented by the formula (9), the temperature and time of the reaction can be appropriately set depending on the type of the compound represented by the formula (9). The time of the reaction is, for example, 1 to 24 hours, and the temperature of the reaction is preferably, for example, at 10 to 70° C.

The reaction with the compound represented by the formula (8) can be promoted, for example, by stirring.

Prior to the step (i),
carboxylic anhydride may be reacted with
a compound represented by the formula (9), a compound having a hydroxyl group (e.g., 4-aminophenol), or a compound having an amino group or a thiol group (preferably added in a small amount to carboxylic anhydride (e.g., preferably 5 to 50 mol %, more preferably 10 to 30 mol %, based on 100 mol % of carboxylic anhydride)).

This allows the terminal of the polyimide precursor having a structural unit represented by the formula (1) to be arbitrarily changed, and the physical properties of the resin after curing can be arbitrarily changed.

The compound having a hydroxyl group and the compound having an amino group or a thiol group may have a double bond, an acetylene group, an epoxy group, a silanol group, an isocyanate group, a maleimide group, and the like in the same molecule.

As the compound having a hydroxyl group, for example, a known compound having a hydroxyl group can be used, and known alcohols and the like can be used. Examples thereof include methanol, ethanol, isopropanol, n-butanol, t-butyl alcohol, n-pentanol, propargyl alcohol, benzyl alcohol and the like.

In addition, 1-hydroxybenzotriazole or derivatives of 1-hydroxybenzotriazole or the like may be used.

As a compound having an amino group or a thiol group, for example, a known compound having an amino group or a thiol group can be used.

As a compound having an amino group, for example, known primary and secondary amines can be used.

Examples thereof include aniline, ethynylaniline, norbornene amine, butylamine, propargylamine, aminostyrene, acrylamide, and the like.

As a compound having a thiol group, for example, a known thiol can be used.

In the method for producing a photosensitive resin composition of the invention, a polyimide precursor is produced by the above-described method, and the obtained polyimide precursor, (B) a polymerizable monomer (hereinafter, also referred to as a "(B) component") and (C) a photopolymerization initiator (hereinafter, also referred to as a "(C) component") are mixed to obtain a photosensitive resin composition.

Mixing can be carried out by a known method.

The polyimide precursor produced by the above-described method may be used directly, or may be diluted with a solvent, and may be replaced with another solvent.

As a solvent, the above-described compound having an ether bond and an amide bond may be used, and a solvent other than a compound having an ether bond and an amide bond may be used.

The solvent may be used alone or in combination of two or more.

The content of the solvent is not particularly limited, but is generally 50 to 1000 parts by mass based on 100 parts by mass of the polyimide precursor produced by the above-described method.

Examples of the component (B) include diethylene glycol diacrylate, triethylene glycol diacrylate, tetraethylene glycol diacrylate, diethylene glycol dimethacrylate, triethylene glycol dimethacrylate, tetraethylene glycol dimethacrylate, 1,4-butanediol diacrylate, 1,6-hexanediol diacrylate, 1,4-butanediol dimethacrylate, 1,6-hexanediol dimethacrylate, and the like.

Examples of the component (B) also include trimethylolpropane diacrylate, trimethylolpropane triacrylate, trimethylolpropane dimethacrylate, trimethylolpropane trimethacrylate, pentaerythritol triacrylate, pentaerythritol tetraacrylate, pentaerythritol trimethacrylate, pentaerythritol tetramethacrylate, tetramethylolmethanetetraacrylate, tetramethylolmethanetetraacrylate, dipentaerythritol hexaacrylate, dipentaerythritol hexamethacrylate, ethoxylated pentaerythritol tetraacrylate, ethoxylated isocyanuric acid triacrylate, ethoxylated isocyanuric acid trimethacrylate, acryloyloxyethyl isocyanurate, methacryloyloxyethyl isocyanurate, and the like.

The component (B) may be used alone or in combination of two or more.

The content of the component (B) is preferably 1 to 50 parts by mass based on 100 parts by mass of the polyimide precursor produced by the above-described method. From the viewpoint of improving hydrophobicity of the cured product, the content is more preferably 5 to 50 parts by mass, and still more preferably 5 to 40 parts by mass.

Within the above range, a practical relief pattern is easily obtained, and residue after development of an unexposed portion is easily suppressed.

Examples of the component (C) preferably include, but not limited to, for example, benzophenone derivatives such as benzophenone, methyl o-benzoylbenzoate, 4-benzoyl-4'-methyldiphenyl ketone, dibenzyl ketone, and fluorenone;
acetophenone derivatives such as 2,2'-diethoxyacetophenone, 2-hydroxy-2-methylpropiophenone, and 1-hydroxycyclohexylphenyl ketone;
thioxanthone derivatives such as thioxanthone, 2-methylthioxanthone, 2-isopropylthioxanthone, and diethylthioxanthone;
benzyl derivatives such as benzyl, benzyl dimethyl ketal, and benzyl-β-methoxyethyl acetal;
benzoin derivatives such as benzoin and benzoin methyl ether; and
oxime esters such as 1-phenyl-1,2-butanedione-2-(o-methoxycarbonyl) oxime, 1-phenyl-1,2-propanedione-2-(o-methoxycarbonyl) oxime, 1-phenyl-1,2-propanedione-2-(o-ethoxycarbonyl) oxime, 1-phenyl-1,2-propanedione-2-(o-benzoyl) oxime, 1,3-diphenylpropanetrione-2-(o-ethoxycarbonyl) oxime, 1-phenyl-3-ethoxypropanetrione-2-(o-benzoyl) oxime, ethanone, 1-[9-ethyl-6-(2-methylbenzoyl)-9H-carbazol-3-yl]-, 1-(O-acetyloxime), and a compound represented by the following formula; and the like.

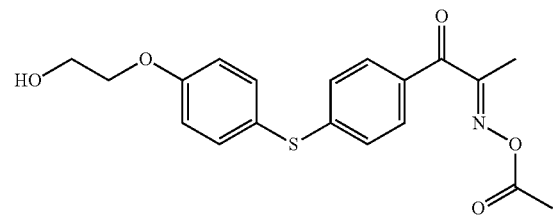 [SMILES: CC(=O)O/N=C(\C)C(=O)c1ccc(Sc2ccc(OCCO)cc2)cc1]

In particular, oxime esters are preferable from the viewpoint of photosensitivity.

The component (C) may be used alone or in combination of two or more.

The content of the component (C) is preferably 0.1 to 20 parts by mass, more preferably 0.1 to 10 parts by mass, and still more preferably 0.1 to 5 parts by mass, based on 100 parts by mass of the polyimide precursor produced by the above-described method.

Within the above range, the crosslink tends to be uniform in the film thickness direction, and a practical relief pattern can be easily obtained.

In the method for producing a photosensitive resin composition of the invention, one or more additives such as a coupling agent, a surfactant or leveling agent, rust inhibitor, polymerization inhibitor, and an adhesive aid may be further mixed.

The method for producing a pattern cured product of the invention contains a step of producing a photosensitive resin composition by the above-described method, a step of coating the obtained photosensitive resin composition on a substrate and drying to form a photosensitive resin film, a step of pattern-exposing the photosensitive resin film to obtain a resin film, a step of developing the resin film after pattern-exposure using an organic solvent to obtain a pattern resin film, and a step of heat-treating the pattern resin film.

As a result, a pattern cured product can be obtained.

Further, a cured product without a pattern may be obtained using the photosensitive resin composition obtained by the above-described method.

A method of producing a cured product without a pattern comprises, for example, the above-described steps of forming a photosensitive resin film and a step of heat treatment. Further, a step of exposing may be comprised.

As a result, a cured product without a pattern can be obtained.

The thickness of the pattern cured product and the cured product without a pattern is preferably 3 to 30 μm.

Examples of the substrate include a glass substrate; a semiconductor substrate such as a Si substrate (a silicon wafer), a metal-oxide-insulator substrate such as a TiO₂ substrate, and a SiO$_2$ substrate; a silicon nitride substrate, a copper substrate, and a copper alloy substrate.

The method for coating is not particularly limited, but can be performed using spinner and bar-coater or the like.

The drying can be performed using a hot plate, an oven, or the like.

The drying temperature is preferably 90 to 150° C., and more preferably 90 to 120° C. from the viewpoint of ensuring dissolution contrast. The drying time is preferably 30 seconds to 5 minutes, and drying may be performed two or more times.

As a result, a photosensitive resin film in which the photosensitive resin composition described above is formed in a film shape can be obtained.

The thickness of the photosensitive resin film is preferably 5 to 100 µm, more preferably 8 to 50 µm, and still more preferably 10 to 30 µm.

In the pattern exposure, for example, a predetermined pattern is exposed through a photomask.

Examples of the active light to be irradiated include ultraviolet rays such as i-ray, visible ray, radiant ray, and the like, and i-ray is preferable.

As the exposure apparatus, a parallel exposure machine, a projection exposure machine, a stepper, a scanner exposure machine, or the like can be used.

As a result of development, a pattern resin film can be obtained. Generally, when a positive photosensitive resin composition is used, the unexposed portion is removed with a developer.

As the organic solvent used as the developer, a good solvent of the photosensitive resin film can be used alone or a good solvent and a poor solvent can be appropriately mixed.

Examples of the good solvent include N-methyl-2-pyrrolidone, N-acetyl-2-pyrrolidone, N,N-dimethylacetamide, N,N-dimethylformamide, dimethylsulfoxide, gammabutyrolactone, α-acetyl-gammabutyrolactone, cyclopentanone, cyclohexanone, and the like.

Examples of the poor solvent include toluene, xylene, methanol, ethanol, isopropanol, propylene glycol monomethyl ether acetate, propylene glycol monomethyl ether, water, and the like.

A surfactant may be added to the developer. The additive amount is preferably 0.01 to 10 parts by mass and more preferably 0.1 to 5 parts by mass with respect to 100 parts by mass of the developer.

The development time can be, for example, twice as long as the time until the photosensitive resin film is immersed and completely dissolved.

The development time also varies depending on the polyimide precursor produced by the above-described method, but is preferably from 10 seconds to 15 minutes, more preferably from 10 seconds to 5 minutes, and still more preferably from 20 seconds to 5 minutes from the viewpoint of productivity.

After development, washing may be performed with a rinse solution.

As the rinse solution, distilled water, methanol, ethanol, isopropanol, toluene, xylene, propylene glycol monomethyl ether acetate, propylene glycol monomethyl ether, or the like may be used alone or as a mix as appropriate, or may be used in a stepwise combination.

A pattern cured product can be obtained by heat-treating the pattern resin film.

The polyimide precursor may undergo a dehydration ring-closing reaction by a heat treatment step to become the corresponding polyimide.

The temperature of the heat treatment is preferably 250° C. or less, more preferably 120 to 250° C., and still more preferably 200° C. or less or 150 to 200° C.

Within the above range, damage to the substrate and the device can be suppressed to a small level, the device can be produced with a high yield, and energy saving of the process can be realized.

The time of the heat treatment is preferably 5 hours or less, more preferably 30 minutes to 3 hours.

Within the above range, the crosslinking reaction or the dehydration ring closure reaction can sufficiently proceed.

The atmosphere of the heat treatment may be an air atmosphere or an inert atmosphere such as nitrogen, but from the viewpoint of preventing oxidation of the pattern resin film, the atmosphere is preferably a nitrogen atmosphere.

Examples of the device used for the heat treatment include a quartz tube oven, a hot plate, a rapid thermal annealing, a vertical diffusion furnace oven, an infrared curing oven, an electron beam curing oven, and a microwave curing oven.

The pattern cured product and the cured product without a pattern produced by the above-described method can be used as a passivation film, a buffer coat film, an interlayer insulating film, a cover coat layer, a surface protective film, or the like.

With the use of one or more selected from the group consisting of the passivation film, the buffer coat film, the interlayer insulating film, the cover coat layer, the surface protective film, and the like, highly reliable electronic components such as semiconductor devices, multilayer wiring boards, and various electronic devices can be produced.

An exemplary process for producing a semiconductor device which is an electronic component obtained by the method of the invention will be described with reference to the drawings.

FIG. 1 is a process diagram of a method for producing an electronic component according to an embodiment of the invention, specifically, a process diagram of a method for producing a semiconductor device having a multi-layer wiring structure.

In FIG. 1, a semiconductor substrate 1 such as a Si substrate having a circuit device is covered with a protective film 2 such as a silicon oxide film except a predetermined portion of the circuit device, and a first conductive layer 3 is formed on the exposed circuit device. Thereafter, an interlayer insulating film 4 is formed on the semiconductor substrate 1.

Next, a photosensitive resin layer 5 such as a chlorinated rubber-based resin, a phenolic novolac-based resin, or the like is formed on the interlayer insulating film 4, and a window 6A is provided so that a predetermined portion of the interlayer insulating film 4 is exposed by a known photolithography technique.

The interlayer insulating film 4 in which the window 6A is exposed is selectively etched to provide a window 6B.

Next, the photosensitive resin layer 5 is removed by using an etchant that corrodes the photosensitive resin layer 5 without corroding the first conductive layer 3 exposed from the windows 6B.

Further, the second conductive layer 7 is formed and electrically connected to the first conductive layer 3 by using a known photolithography technique.

In the case of forming a multilayer wiring structure of three or more layers, each layer can be formed by repeating the above steps.

Next, by using photosensitive resin composition obtained in the above-described method, the window 6C is opened by pattern exposure, and a surface protective film 8 is formed. The surface protective film 8 protects the second conductive layer 7 from external stress, a rays, and the like, and the resulting semiconductor device is excellent in reliability.

In the above-mentioned example, the interlayer insulating film can also be formed using the photosensitive resin composition obtained by the method of the invention.

EXAMPLES

Hereinafter, the present invention will be described more specifically on the basis of Examples and Comparative Examples. The present invention is not limited to the following Examples.

Evaluation of Workability

Hereinafter, in Example 1 and Comparative Examples 1 to 2, those satisfying all of the following items are defined as ○ (good):
- a polyamic acid or a polyimide precursor does not undergo gelation during synthesis;
- filtration can be carried out (in the case that filtration is carried out two or more times, the total time of the two or more filtration is) within 2 hours;
- a polymer having a weight-average molecular weight within plus/minus 5,000 of the weight-average molecular weight of the polymer of Example 1 can be obtained; and
- a polymer with a dispersity of 1.0 to 3.0 can be obtained. Those that do not satisfy at least one of the above items were defined as X (poor).

Example 1 (Synthesis of Polymer I)

To a solution of 23.5 g of 3,3',4,4'-diphenyl ether tetracarboxylic dianhydride (ODPA) dissolved in 190 g of 3-methoxy-N,N-dimethylpropionamide, a solution of 13 g of 2,2'-dimethylbiphenyl-4,4'-diamine (DMAP) dissolved in 75 g of 3-methoxy-N,N-dimethylpropionamide was added dropwise and stirred at 30° C. for 2 hours to obtain a polyamic acid.

37 g of trifluoroacetic anhydride was added thereto at 40° C. or less, and after stirring for 3 hours at 45° C., 25.5 g of 2-hydroxyethyl methacrylate (HEMA) was added and stirring was carried out at 40° C. for 10 hours. This reaction solution was added dropwise to distilled water, and the precipitate was collected by filtration, and dried under reduced pressure, and these steps were repeated 3 times to obtain a polyimide precursor (hereinafter, referred to as polymer I). The time taken for filtration was 1.5 hours in total time of three filtration.

The weight-average molecular weight, the number-average molecular weight, and the degree of dispersion were determined by standard polystyrene conversion using the gel permeation chromatography (GPC) method under the following conditions. The weight-average molecular weight of polymer I was 20,000 and the degree of dispersion was 1.74.

A solution of 1 mL solvent [tetrahydrofuran (THF)/dimethylformamide (DMF)=1/1 (volume ratio)] per 0.5 mg of polymer I was used for the measurement. The degree of dispersion of polymer I was calculated by dividing the weight-average molecular weight by the number-average molecular weight.

Measuring instrument: Detector L4000UV manufactured by Hitachi, Ltd.
Pumps: L6000 manufactured by Hitachi, Ltd.
C-R4A Chromatopac manufactured by Shimadzu Corporation
Measuring conditions: column Gelpack GL-S300MDT-5×2
Eluent: THF/DMF=1/1 (volume ratio)
LiBr (0.03 mol/L), $H_3PO_4$ (0.06 mol/L)
Flow rate: 1.0 mL/min, detector: UV 270 nm The esterification ratio of polymer I (the ratio of reaction with the HEMA of the carboxylic group of ODPA) was calculated by NMR-measurement under the following condition. The esterification ratio was 74 mol %, based on the total carboxyl groups of the polyamide acid, with the remaining 26 mol % being carboxyl groups.

Measuring instrument: AV400M manufactured by Bruker BioSpin K.K.
Magnetic field strength: 400 MHz
Reference substance: tetramethylsilane (TMS)
Solvent: dimethylsulfoxide (DMSO)

Comparative Example 1

Except for the use of 1,3-dimethyl-2-imidazolidinone (DMI) in place of 3-methoxy-N,N-dimethylpropionamide, HEMA was added and stirred in the same manner as in Example 1. However, the reaction solution gelled and no polyimide precursor was obtained.

Comparative Example 2 (Synthesis of Polymer II)

Except for the use of γ-butyrolactone (GBL) instead of 3-methoxy-N,N-dimethylpropionamide, a polyimide precursor was prepared (hereinafter referred to as polymer II) and evaluated in the same manner as in Example 1. When the reaction solution, which was stirred with HEMA, was dropped into distilled water, the polymer did not turn into powder, but into clay, and therefore, it took a total of 3 hours for three filtration.

The weight-average molecular weight of polymer II was 8,000 and the degree of dispersion was 5.18. In addition, the esterification ratio of polymer II was 49%.

The above results are summarized in Table 1. The weight-average molecular weight "-" indicates that the measurement was not possible.

TABLE 1

|  | Example 1 | Comparative Example 1 | Comparative Example 2 |
|---|---|---|---|
| Obtained polymer | Polymer I | — | Polymer II |
| Solvent | 3-methoxy-N,N-dimethylpropionamide | DMI | GBL |
| Weight-average molecular weight | 20,000 | — | 8,000 |
| Workability | ○ | X | X |

Example 2

(Preparation of the Photosensitive Resin Composition)

100 parts by mass of polymer I was dissolved in 150 parts by mass of 3-methoxy-N,N-dimethylpropionamide, and 20 parts by mass of tetraethylene glycol dimethacrylate (manufactured by Shin-Nakamura Chemical Co., Ltd.), 15 parts by mass of pentaerythritol tetraacrylate (manufactured by Shin-Nakamura Chemical Co., Ltd.), 0.2 parts by mass of IRUGCURE OXE 02 (manufactured by BASF Japan Co., Ltd., ethanone, 1-[9-ethyl-6-(2-methylbenzoyl)-9H-carbazol-3- yl]-, 1-(O-acetyloxime)), 2 parts by mass of PDO (manufactured by Lanbson Ltd., 1-phenyl-1,2-propanedione-2-(o-ethoxycarbonyl)oxime) was added thereto to prepare a photosensitive resin composition.

(Evaluation of Sensitivity)

The obtained photosensitive resin composition was spin-coated on a silicon wafer using a coating device Act8 (manufactured by Tokyo Electron Limited), dried at 100° C. for 2 minutes, and then dried at 110° C. for 2 minutes to form a photosensitive resin film having a dry film thickness of 13 μm.

The development time was set to twice the time required to completely dissolve the obtained photosensitive resin film by immersion in cyclopentanone.

In addition, a photosensitive resin film was produced in the same manner as described above, and the obtained photosensitive resin film was exposed by irradiating predetermined patterns with i-ray of 100 to 600 mJ/cm$^2$ at 50 mJ/cm$^2$ increment using an i-ray stepper FPA-3000iW (manufactured by Canon Inc.).

The exposed resin film was paddle-developed in cyclopentanone using an Act8 for the above development time, and then rinsed with propylene glycol monomethyl ether acetate (PGMEA) to obtain a pattern resin film.

The lower limit of the exposure dose at which the film thickness of the obtained pattern resin film became 80% or more of the film thickness of the photosensitive resin film before exposure was defined as sensitivity.

The sensitivity was 150 mJ/cm$^2$ and exhibited good sensitivity.

(Production of Pattern Cured Product)

The patterned resin film obtained in evaluation of sensitivity was heated at 175° C. for 2 hours in a nitrogen atmosphere using a vertical diffusion furnace μ-TF (manufactured by Koyo Thermo Systems Co., Ltd.) to obtain a good pattern cured product (film thickness after curing: 10 μm).

While some embodiments and/or examples of the invention have been described in detail above, those skilled in the art will readily make many changes to these illustrative embodiments and/or examples without materially departing from the novel teachings and advantages of the invention. Accordingly, many of these modifications are within the scope of the invention.

The entire contents of the documents described herein are incorporated by reference.

The invention claimed is:

1. A method for producing a polyimide precursor having a structural unit represented by the following formula (1), comprising the following steps (i) and (ii), wherein at least one of the steps (i) and (ii) is carried out in a solvent comprising a compound represented by the following formula (10):

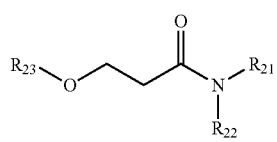

(10)

wherein in the formula (10), $R_{21}$ to $R_{23}$ are independently an alkyl group including 1 to 10 carbon atoms:

(i) a step of reacting carboxylic anhydride with a diamine compound to obtain a polyimide precursor having a structural unit represented by the following formula (2); and (ii) a step of reacting the polyimide precursor having a structural unit represented by the formula (2) with a compound represented by the following formula (8), and reacting the reactant with a compound represented by the following formula (9) to obtain a polyimide precursor having a structural unit represented by the following formula (1):

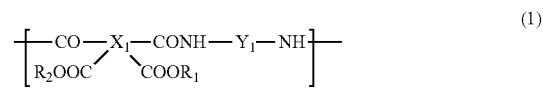

(1)

wherein in the formula (1), $X_1$ is a tetravalent group having one or more aromatic groups; —$COOR_1$ group and —CONH— group are on the ortho-position to each other; —$COOR_2$ group and —CO— group are on the ortho-position to each other; $Y_1$ is a divalent aromatic group; $R_1$ and $R_2$ are independently a hydrogen atom, a group represented by the following formula (3), or a aliphatic hydrocarbon group including 1 to 4 carbon atoms; and at least one of $R_1$ and $R_2$ is a group represented by the formula (3):

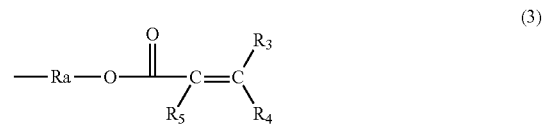

(3)

wherein in the formula (3), Ra is a divalent aliphatic hydrocarbon group including 1 to 20 carbon atoms; and $R_3$ to $R_5$ are independently a hydrogen atom or an aliphatic hydrocarbon group including 1 to 3 carbon atoms:

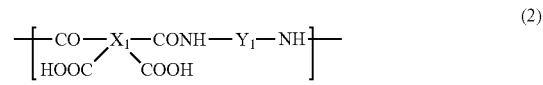

(2)

wherein in the formula (2), $X_1$ is a group corresponding to $X_1$ of the formula (1); and $Y_1$ is as defined in the formula (1):

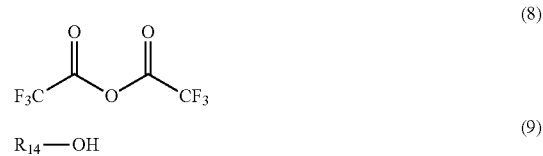

(8)

$R_{14}$—OH (9)

wherein in the formula (9), $R_{14}$ is a group represented by the formula (3).

2. The method for producing a polyimide precursor according to claim 1, wherein in the formula (10), $R_{21}$ to $R_{23}$ are independently an alkyl group including 1 to 3 carbon atoms.

3. A method for producing a photosensitive resin composition comprising:
conducting the following steps (i) and (ii), wherein at least one of the steps (i) and (ii) is carried out in a solvent comprising a compound represented by the following formula (10):

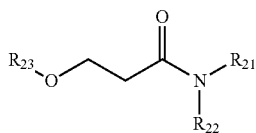
(10)

wherein in the formula (10), $R_{21}$ to $R_{23}$ are independently an alkyl group including 1 to 10 carbon atoms:
(i) a step of reacting carboxylic anhydride with a diamine compound to obtain a polyimide precursor having a structural unit represented by the following formula (2); and
(ii) a step of reacting the polyimide precursor having a structural unit represented by the formula (2) with a compound represented by the following formula (8), and reacting the reactant with a compound represented by the following formula (9) to obtain a polyimide precursor having a structural unit represented by the following formula (1):

(1)

wherein in the formula (1), $X_1$ is a tetravalent group having one or more aromatic groups; —$COOR_1$ group and —CONH— group are on the ortho-position to each other; —$COOR_2$ group and —CO— group are on the ortho-position to each other; $Y_1$ is a divalent aromatic group; $R_1$ and $R_2$ are independently a hydrogen atom, a group represented by the following formula (3), or a aliphatic hydrocarbon group including 1 to 4 carbon atoms; and at least one of $R_1$ and $R_2$ is a group represented by the formula (3):

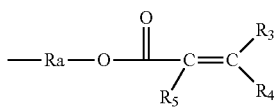
(3)

wherein in the formula (3), Ra is a divalent aliphatic hydrocarbon group including 1 to 20 carbon atoms; and $R_3$ to $R_5$ are independently a hydrogen atom or an aliphatic hydrocarbon group including 1 to 3 carbon atoms:

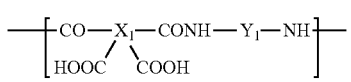
(2)

wherein in the formula (2), $X_1$ is a group corresponding to $X_1$ of the formula (1); and $Y_1$ is as defined in the formula (1):

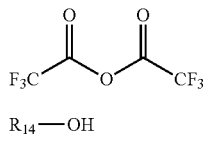
(8)

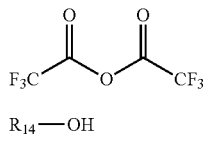
$R_{14}$—OH (9)

wherein in the formula (9), $R_{14}$ is a group represented by the formula (3); and
mixing the polyimide precursor having the structural unit represented by the formula (1), (B) a polymerizable monomer, and (C) a photopolymerization initiator to obtain a photosensitive resin composition.

4. A method for producing a pattern cured product, comprising the following steps:
conducting the following steps (i) and (ii), wherein at least one of the steps (i) and (ii) is carried out in a solvent comprising a compound represented by the following formula (10):

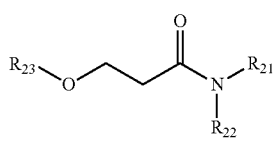
(10)

wherein in the formula (10), $R_{21}$ to $R_{23}$ are independently an alkyl group including 1 to 10 carbon atoms:
(i) a step of reacting carboxylic anhydride with a diamine compound to obtain a polyimide precursor having a structural unit represented by the following formula (2); and
(ii) a step of reacting the polyimide precursor having a structural unit represented by the formula (2) with a compound represented by the following formula (8), and reacting the reactant with a compound represented by the following formula (9) to obtain a polyimide precursor having a structural unit represented by the following formula (1):

(1)

wherein in the formula (1), $X_1$ is a tetravalent group having one or more aromatic groups; —$COOR_1$ group and —CONH— group are on the ortho-position to each other; —$COOR_2$ group and —CO— group are on the ortho-position to each other; $Y_1$ is a divalent aromatic group; $R_1$ and $R_2$ are independently a hydrogen atom, a group represented by the following formula (3), or a aliphatic hydrocarbon group including 1 to 4 carbon atoms; and at least one of $R_1$ and $R_2$ is a group represented by the formula (3):

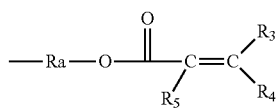
(3)

wherein in the formula (3), Ra is a divalent aliphatic hydrocarbon group including 1 to 20 carbon atoms; and $R_3$ to $R_5$ are independently a hydrogen atom or an aliphatic hydrocarbon group including 1 to 3 carbon atoms:

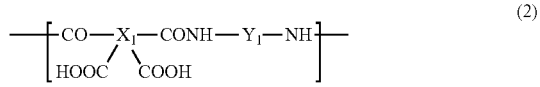
(2)

wherein in the formula (2), $X_1$ is a group corresponding to $X_1$ of the formula (1); and $Y_1$ is as defined in the formula (1):

(8)

$R_{14}$—OH (9)

wherein in the formula (9), $R_{14}$ is a group represented by the formula (3);

mixing the polyimide precursor having the structural unit represented by the formula (1), (B) a polymerizable monomer, and (C) a photopolymerization initiator to obtain a photosensitive resin composition;

coating the photosensitive resin composition on a substrate and drying to form a photosensitive resin film;

pattern-exposing the photosensitive resin film to obtain a resin film;

developing the resin film after the pattern exposure using an organic solvent to obtain a pattern resin film; and heat-treating the pattern resin film.

5. The method for producing a pattern cured product according to claim 4, wherein a temperature of the heat treatment is 200° C. or less.

6. A method for producing an interlayer insulating film, a cover coat layer or a surface protective film, which is produced using the pattern cured product produced by the method according to claim 4.

7. A method for producing an electronic component, which is produced using the interlayer insulating film, the cover coat layer or the surface protective film produced by the method according to claim 6.

8. The method for producing a polyimide precursor according to claim 1, wherein the compound represented by the formula (10) is 3-methoxy-N,N-dimethylpropionamide.

* * * * *